United States Patent [19]

Romania et al.

[11] 4,413,413
[45] Nov. 8, 1983

[54] CUTTING TOOL FOR USE ON PRINTED CIRCUIT BOARD WIRING

[75] Inventors: Samuel R. Romania, Phoenixville; Frank L. Watson, Paoli, both of Pa.

[73] Assignee: Burroughs Corporation, Detroit, Mich.

[21] Appl. No.: 366,354

[22] Filed: Apr. 7, 1982

[51] Int. Cl.³ .............................................. B26B 27/00
[52] U.S. Cl. ................................... 30/300; 29/402.06
[58] Field of Search ................ 30/287, 300, 301, 310, 30/316; 228/160, 19; 29/426.4, 402.06

[56] References Cited

U.S. PATENT DOCUMENTS

| | | | |
|---|---|---|---|
| 2,505,236 | 4/1950 | Dooley | 30/310 X |
| 2,546,292 | 3/1951 | Bell | 30/310 X |
| 2,573,462 | 10/1951 | Lindsey | 30/300 X |
| 3,466,732 | 9/1969 | Taylor | 29/402.06 |
| 4,261,093 | 4/1981 | Steffen | 29/426.4 |

Primary Examiner—Jimmy C. Peters
Attorney, Agent, or Firm—Francis A. Varallo; Edmund M. Chung; Kevin R. Peterson

[57] ABSTRACT

A tool is described for facilitating the cutting of printed circuit board wires necessitated by changes in the circuit design or the occurrence of electrical faults. The tool is particularly useful with circuit boards having high density wiring, where it virtually eliminates damage to printed wires adjacent to those being severed. Comprised of a guide pin centrally disposed with respect to an annular cutting edge, the tool uses the former for registration with the component and via holes in the circuit board, and the latter, to sever the printed wires from the electrically conductive pads surrounding the holes. The depth of the cut is carefully controlled by the tool and may be chosen to eliminate electrical faults lying below the surface in a multilayer board.

8 Claims, 7 Drawing Figures

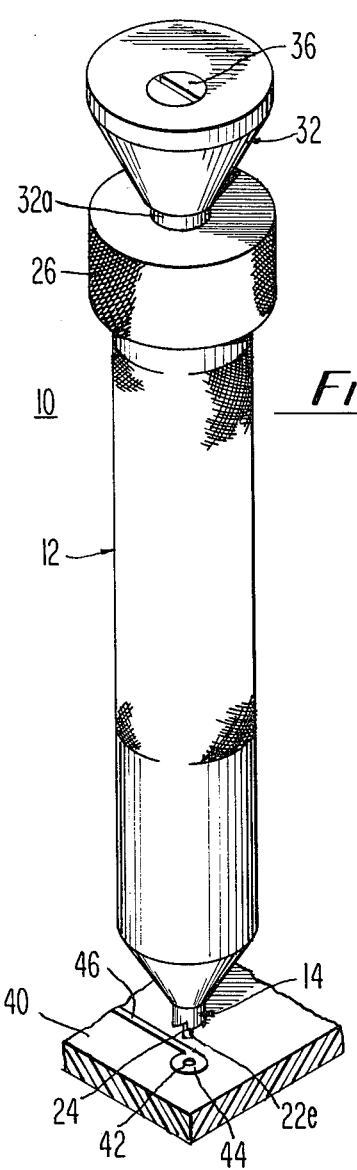
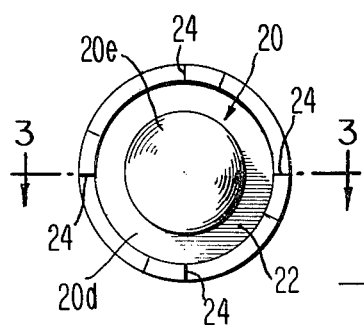
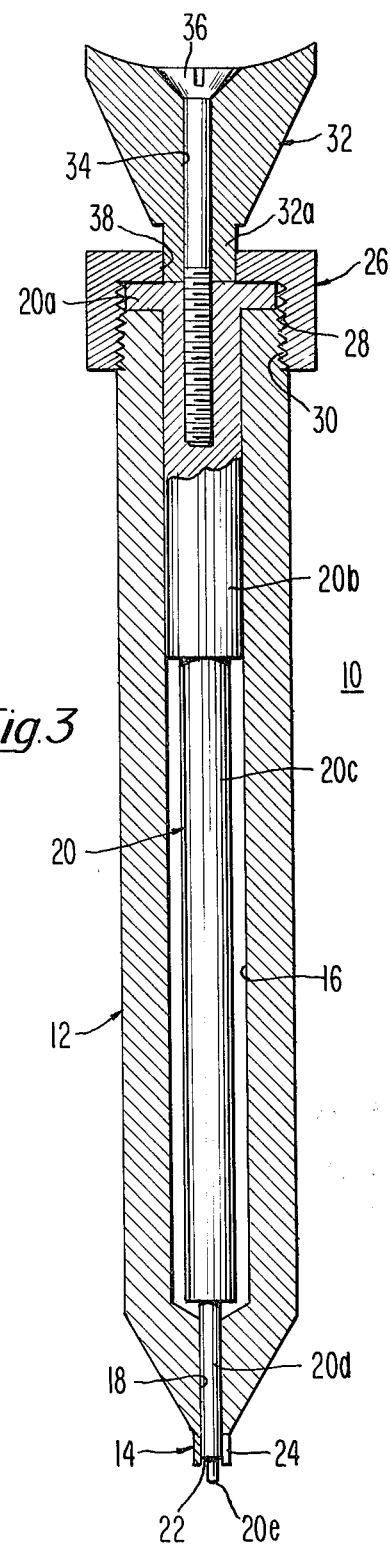

CUTTING TOOL FOR USE ON PRINTED CIRCUIT BOARD WIRING

BACKGROUND OF THE INVENTION

In large scale electronic circuit design such as that utilized for data processors, the implementation thereof in printed circuit board wiring generally requires several levels of prototype test and evaluation before finalization. During this period, the initially designed printed circuit boards often require modifications to permit changes in logic or additions of functions previously omitted. Since a sizeable number of different printed circuit boards may be involved, it is not practical to lay out and fabricate new boards for each change. Instead, some means must be provided to alter the interim printed wiring. This is generally accomplished by cutting appropriate printed leads to provide open circuits and reestablishing circuit paths by using external wires to connect portions of a board or to interconnect different boards.

Common methods of severing the printed leads on the circuit boards include a hand held razor blade type knife or an engraving type motor tool with a rotating or oscillating abrasive bit. The difficulty with these rather primitive methods is that the cutting operation is uncontrolled as to precise location or the depth of cut. Accordingly, adjacent printed wires which are closely spaced to those being severed in high density boards may be damaged, or in the case of multilayer boards, printed leads below the board surface may be inadvertently severed. Additionally, the use of these methods, even when carefully implemented by an operator, is tedious and time consuming.

It has also been observed that electrical faults sometimes lie below the board surface in multilayer boards. One such fault produced by metallic whiskers formed during the manufacturing process, causes short circuits to occur between the printed wiring and metallized via holes.

What is required is a hand held, simple, low cost tool that provides a method of controlled cutting of printed circuit leads or spurious conductive paths, with respect to location as well as depth within the board. The cutting tool of the present invention fills this need.

SUMMARY OF THE INVENTION

In accordance with the present invention, a tool is provided for cutting the printed wiring leads which interconnect electrically conductive pads situated respectively at the sites of component and via holes in the board. The tool uses the last mentioned holes for registration and control purposes in performing its cutting function.

The cutting tool is comprised of an assembly of two basic parts, namely, a generally tubular body member tapering toward one of its extremities and terminating in a multi-toothed annular cutting edge; and a spindle having an integral guide pin section at one extremity thereof and a finger grip member attached to its opposite extremity. Means are provided for retaining the spindle within the body member such that the end of the guide pin is centrally disposed with respect to the cutting edge and protrudes beyond the outermost portions thereof. The body member remains free to rotate about the spindle. The guide pin section also includes a shoulder, spaced a preset distance from the outermost portions of the cutting edge and serving to establish the maximum cutting depth for the tool.

In using the tool, the operator inserts the guide pin into the hole in the printed circuit board around which the cut is to be made. The tool is then held perpendicular to the board surface by the finger grip member and the spindle is prevented from rotating in the hole. The outermost portions of the toothed cutting edge now rest upon the circuit metallization. The operator then rotates the body member about the spindle while applying pressure to the spindle finger grip in the direction of the board. The cutting operation proceeds until the shoulder of the guide pin section contacts the upper surface of the pad. Thus, while the cutting edge has the capability of cutting deeper into the board surface, it is prevented from doing so by the shoulder. It is apparent therefore, that if the tool is to be employed for correcting electrical faults in the vicinity of via holes, which faults lie below the board surface, the longitudinal displacement of the shoulder and the outermost portion of the cutting edge will be preset accordingly. Following the cutting operation, the tool is withdrawn. The printed circuit leads formerly connected to the pad are now open circuited, having been cleanly separated from the pad by the annular groove generated by the cutting tool.

The present invention provides a highly effective, reliable tool characterized by simplicity and low cost of fabrication. Other features and advantages of the invention will become more fully apparent in the detailed description of the tool and its mode of operation which follows.

BRIEF DESCRIPTION OF THE INVENTION

FIG. 1 is a pictorial view of the cutting tool of the present invention, and a portion of a printed circuit board.

FIG. 2 is a bottom view of the tool of FIG. 1, illustrating the relationship of the multi-toothed cutting edge to the centrally disposed guide pin section of the spindle.

FIG. 3 is a section view taken along the lines 3—3 of FIG. 2 and depicting the internal structure of the tool.

DESCRIPTION OF THE PREFERRED EMBODIMENT

Figure 5:
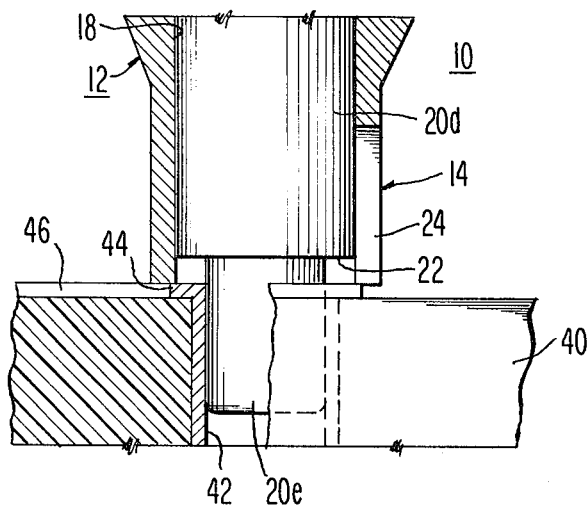
FIG. 5 depicts in greatly enlarged detail, an edge portion of a printed circuit board with the cutting tool of FIG. 1 registered in a via hole, prior to the circuit lead cutting operation.

A pictorial view of the printed wiring cutting tool 10 of the present invention appears in FIG. 1. The internal tool structure is apparent in the section view of FIG. 3, which is derived from the bottom view of FIG. 2. With reference to FIGS. 1 through 3, the tool 10 is comprised of a tubular body member 12, tapered at one extremity thereof, and terminating in a cutting edge 14. Body member 12 includes a pair of contiguous concentric bores 16 and 18. A spindle 20 is provided which is comprised of a plurality of contiguous cylindrical sections 20a through 20e. The largest diameter section 20a at one extremity of spindle 20 is larger than bore 16 of body member 12 and bears against one extremity of the latter. Spindle sections 20b and 20d are accommodated respectively by bores 16 and 18. Section 20c is of lesser diameter than bore 16 to minimize frictional resistance to rotation of body member 12 about spindle 20. Guide pin section 20e appears at the opposite extremity of spindle 20. The juncture of guide pin section 20e with section 20d provides a shoulder 22 which is important in controlling the maximum cutting depth of the tool, as will be described hereinafter.

The relationship of the centrally disposed guide pin section 20e and its shoulder 22 to the annular cutting edge 14 is seen particularly in the bottom view of FIG. 2. The presence of a plurality of cutting teeth 24 are indicated in the last mentioned figure. The geometry of teeth 24, four in number employed in an actual operative embodiment of the invention, is shown in FIG. 4.

With continued reference to FIGS. 1 and 3, the spindle 20 is retained in body member 12 by a cap 26 having internal threads 28 for engaging mating threads 30 on the surface of body member 12. Adequate, but minimal, clearance is provided between the respective adjacent surfaces of cap 26 and section 20a of spindle 20 to permit body member 12 to rotate on its longitudinal axis freely about spindle 20, when cap 26 is fully tightened down on body member 12. A finger grip section 32 having an integral shaft portion 32a, and including a central bore 34 for receiving a screw fastener 36 completes the tool assembly. Shaft portion 32a contacts section 20a of spindle 12 via an aperture 38 in cap 26. Section 20a and at least a portion of section 20b are drilled and tapped to receive the threaded extremity of fastener 36.

FIG. 1 also illustrates a fragment of a printed circuit board 40. The latter includes a plated-through via hold 42 surrounded by an electrically conductive pad 44 integral with the metallization within the hole, and a printed lead 46 connected to the pad 44.

Figure 4:
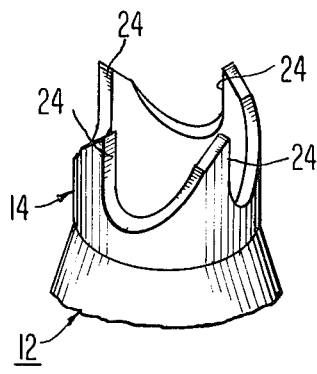
FIG. 4 is a greatly enlarged view of the cutting edge appearing at the extremity of the tool tubular member.

In FIG. 4, the printed circuit board of FIG. 1 and its elements, the via hole 42, pad 44 and lead 46 are shown greatly enlarged in an edge view. It may be assumed that the lead 46 is to be severed from its pad 44 in order to make a circuit change. The operator has inserted the guide pin section 20e of the tool into the via hole 42 for properly registering the latter with the pad and lead locations. The guide pin section 20e is designed to fit freely into via hole 42 but with close dimensional tolerances. The extremities of teeth 24 of cutting edge 14 are shown contacting portions of the surfaces of the pad 44 and lead 46. Shoulder 22 of the guide pin section 20e is displaced from the pad surface by a predetermined distance.

In performing the cutting operation, the operator holds tool 10 perpendicular to the board surface by finger grip member 36 (FIG. 3) and applies a moderate pressure along the longitudinal axis of the spindle 20 toward the board 40. Concurrently, while preventing the spindle 20 from rotating in hole 42, the operator rotates the body member 12 about the spindle. The surface of the body member 12 is knurled to prevent it from slipping in the operator's fingers.

Figure 6:
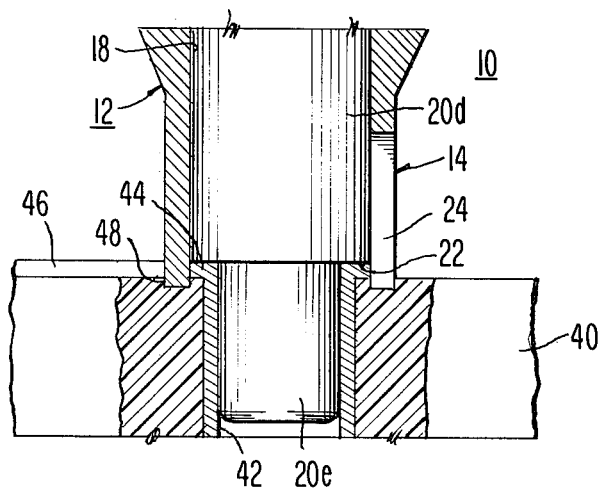
FIG. 6 depicts the relationship of the tool and printed circuit board after the cutting operation.

The cutting operation proceeds until shoulder 22 contacts the surface of pad 44, as seen in FIG. 6. At this point, no further cutting of the board material is possible even if the body member 12 continues to be rotated. It is therefore apparent that the depth of cut is carefully controlled by a preset dimension—the distance between the extremities of cutting teeth 24 and shoulder 22. Thus, if a surface lead is to be severed, care must be taken not to damage subsurface wiring which is present in multilayer boards. On the other hand, if circuit faults caused by unwanted connections to a via hole are present, the depth of cut may be increased to perform this function.

Figure 7:
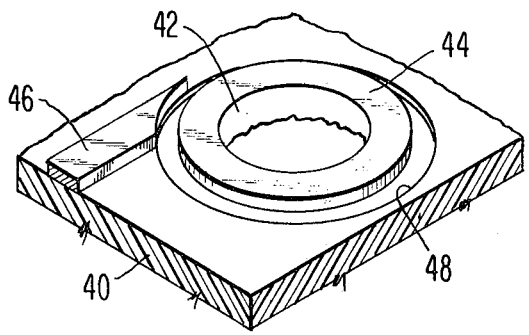
FIG. 7 illustrates pictorially a fragment of the printed circuit board shown in FIGS. 5 and 6, with a printed circuit lead severed from the pad to which it was connected.

As seen in FIG. 7, removal of the cutting tool 10 from the board 40 reveals the formation of a precisely located annular groove 48 generated thereby. This groove encompasses pad 44 at an exact preset depth which is somewhat greater than the thickness of the pad and lead metallization. Lead 46 is cleanly severed from pad 44 and the circuit associated therewith has been opened.

In conclusion, it is submitted that the tool disclosed herein offers a low-cost, simple, timesaving means to perform circuit modifications to high density printed circuit wiring. The inventive concepts and implementation described herein are generic to various applications. In an actual operative situation, the pad diameter is approximately 0.062 inches, the inside and outside diameters of the cutting edge are 0.060 and 0.074 inches respectively, forming a 0.007 inch width groove, 0.005 inches in depth in the surface of the printed circuit board. It should be understood that in other applications, changes and modifications of the tool may be needed to suit particular requirements. Such variations as are within the skill of the designer, and which do not depart from the true scope and spirit of the invention are intended to be covered by the following claims.

What is claimed is:

1. A tool for severing a printed lead from an electrically conductive pad surrounding a hole in a printed circuit board, comprising:

a substantially tubular body member having at one extremity thereof an annular cutting edge, said body member being tapered adjacent said last mentioned extremity, said body member comprising first and second contiguous bores of respective different diameters, a spindle positioned within said body member along the central longitudinal axis thereof, said body member being rotatably disposed about said spindle, said spindle having a guide pin section at one extremity thereof, said spindle having a plurality of contiguous coaxial cylindrical sections, at least a first and second spindle section having diameters capable of being accommodated respectively by said first and second bores, a third of said sections contiguous with said second section but of lesser diameter than the latter being said guide pin section, said last mentioned section protruding beyond the outermost portions of said cutting edge and having a shoulder enclosed by the latter and displaced a predetermined longitudinal distance from said outermost portions thereof, said guide pin section being adapted to engage said hole to provide registration for said tool, the rotation of said body member effecting the severing of said printed lead by said cutting edge, said shoulder of said pin guide section being larger than said hole and controlling the depth of cut made by said cutting edge into the surface of said printed circuit board.

2. A tool as defined in claim 1 further including a fourth spindle section contiguous with said first spindle section and situated at the extremity of said spindle opposite to that having said guide pin section, said fourth spindle section having a larger diameter than said first bore of said body member and bearing against the extremity of said body member opposite to that having said cutting edge.

3. A tool as defined in claim 2 further including a retainer cap disposed over said fourth spindle section for retaining said spindle within said body member, said retainer cap having a central aperture therein.

4. A tool as defined in claim 3 further including a finger grip member having a shaft portion at one extremity thereof, said shaft portion contacting the surface of said fourth spindle section by way of said central aperture in said retainer cap, and means for fastening said finger grip member to said spindle.

5. A tool as defined in claim 4 further characterized in that said retainer cap is formed with a plurality of internal threads, said body member having mating threads on its surface for engaging the former, and said finger grip member having a central opening, said fourth spindle section and at least a portion of said first spindle section having a tapped hole concentric with said last mentioned central opening, said means for fastening said finger grip member to said spindle comprising a screw fastener for engaging the tapped threads in said first and fourth spindle sections via said central opening in said finger grip member.

6. A tool as defined in claim 5 wherein said cutting edge is comprised of a plurality of cutting teeth situated along the periphery of said annular cutting edge, the width of the groove cut into the printed lead being severed from its pad being a function of the respective inside and outside diameters of said cutting edge.

7. A tool as defined in claim 6 further including a fifth spindle section joining said first spindle section to said second spindle section and having a diameter substantially less than said first bore of said body member and substantially greater than the diameter of said second bore, thereby reducing frictional resistance to the rotation of said body member about said spindle during a cutting operation.

8. A tool as defined in claim 7 wherein said body member and said cutting edge are an integral unit and said spindle is constructed in one piece.

* * * * *